METHOD FOR MANUFACTURING IC PACKAGES

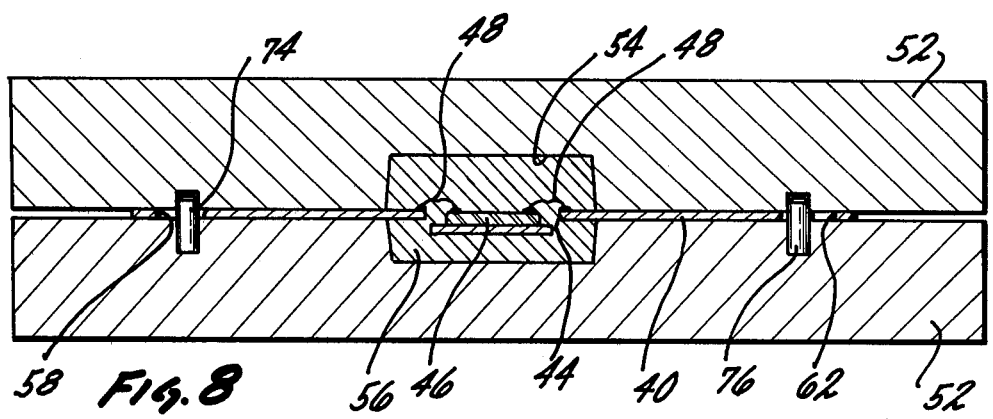
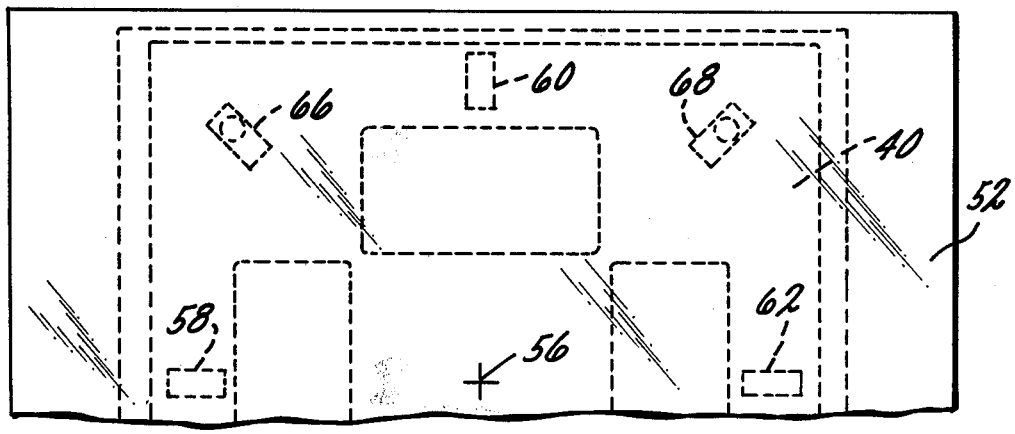
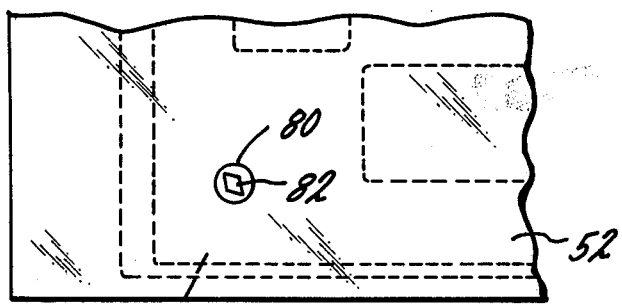
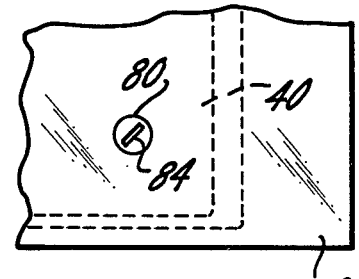

This is a continuation of application Ser. No. 125,450, filed Feb. 28, 1980.

BACKGROUND OF THE INVENTION

This invention relates, in general, to integrated circuit (IC) technology and, in particular, to the method of fabricating packages for IC devices (chips).

More specifically, the invention relates to a method and means for maintaining alignment of components of an IC package when subjected to high temperature during manufacture, such as, when bonding a heat sink to a substrate, or when encapsulating a chip (die) attached to a lead frame with plastic in the manufacture of IC packages.

To explain the invention in the manufacture of IC packages which have heat sinks and substrates, it is conventional to attach a chip, either by wire bonding to conductor leads disposed on a flat substrate of semiconductor material, or to connect the chip directly to such leads on the substrate. The leads conventionally terminate as pads at the edges of the substrate, and in the case of a pin type package, pins are connected to these pads and, in the case of a leadless package, these pads are the terminals themselves. In the latter case, the position of the pads corresponds to the position of the conductors in a mounting socket in which the package is to be mounted for use. A typical example of a leadless package having such terminal pads and a mounting socket is shown in the U.S. Pat. No. 3,946,276 to Braun et al This patent also shows a heat sink, of copper alloy, or aluminum alloy, attached to the substrate for dissipating heat generated during operation of the device. This heat sink is suitably bonded to the substrate as by soldering and, to do this, the temperature of the partially assembled package is raised above the melting point of the solder. However, since the material of the heat sink has a thermal coefficient of expansion which is substantially different from the substrate material, an excursion in the location of the terminal pads may occur especially if the two items were fixtured about their edges. If this does occur, a good electrical connection of all the terminal pads with their respective conductors in the socket becomes virtually impossible.

Accordingly, it becomes apparent that there is a need to provide a means by which a substrate and a heat sink can be bonded together, allow for the difference in the coefficient of expansion, yet maintain the two pieces aligned during the terminal expansion and contraction that occurs during bonding and other steps in the fabrication of an IC package so that there is minimal displacement of the terminal pads from their desired location in the final package.

Now in the manufacture of plastic encapsulated IC packages, the chip (die) is attached to the conductors of a lead frame either by wires between the die and the conductors or directly between the die and the conductors, or via intermediary lead frame devices, which are known as beam leads. The conductors are arranged for connecting the package to a socket or to a similar conductive pattern on a substrate such as a PC board similar to that described in connection with the heat sink package. The lead frame with the die attached is placed in a transfer mold which has a mold cavity which surrounds the die and a part of the leads in the process of forming the package. Such a package may or may not have a heat sink attached thereto, and with or without a heat sink, the problem of the excursion of the conductors of the lead frame during high temperature encapsulation in a mold needs to be solved.

It should also be pointed out that another problem with the movement of the terminal pads and conductors of a lead frame during the fabrication of an IC package whether a heat sink type or not, lies in the fact that often the location hole (or the datum hole, as it is sometimes called), which receives a pin in the mounting socket to thus locate the package in the mounting socket, is not necessarily in the geometric center of either the mounting socket or the package. Since a relatively flat material such as the substrate and a heat sink, when heated and cooled, expands and contracts all directions from its center, that the fact that the datum hole (point of reference) is not in the center of the heat sink or substrate complicates the matter of compensating for the possible movement of the pads or conductors during the thermal expansion and contraction occurring during heating and cooling of the package.

Therefore, it is a first object of the present invention to provide a method and means for maintaining alignment of the various parts of an IC package during the heating and cooling steps in the process of fabrication; such method and means to have universal application whether the package of the heat sink type, pin type or leadless, and whether the package is plastic encapsulated with or without a heat sink.

Thus, still another object of this invention is to provide method and means by which the geometric center of parts of an IC package can be located for purposes of fabrication during heating and cooling steps notwithstanding the fact that the datum hole or locating criteria may not be in the geometric center of the parts.

SUMMARY OF THE INVENTION

The invention which meets the foregoing objects comprises providing a method and an article which includes means both in the part which is subjected to heat during fabrication of an IC package and in the fixture for holding such a part, for accommodating the expansion and contraction of the part during heating and cooling while holding the part in alignment. In one embodiment, the expansion and contraction accommodating means comprises slots arranged as apices of a triangle in the part which receive pins in the fixture with the major axes of the slots in alignment with the point of minimum expansion and contraction of the part.

Utilizing the triangulation principle, the location of the datum hole (or locating criteria), if not at the point of minimum expansion and contraction of the part, can be effectively translated to the center of minimum expansion and contraction.

BRIEF DESCRIPTION OF THE DRAWINGS

FIG. 4 is a cross-sectional view, taken along line 4—4 or FIG. 3, together with a second part of the fixture in the form of a pressure pad and showing the relationship of the substrate, heat sink and fixture at ambient temperature, located matching pins, but whichever of the groups of slots is selected only three matching pins are used such as for example, the three pins 74, 76 and 78 in slots 58, 62 and 64, respectively, to incorporate the triangulation concept. These pins function in the selected slots in the same manner as described in the embodiment shown in FIGS. 1-5. It is noted that FIG. 7 shows the completion of the encapsulation step and the relationship of the pins to the slots while

FIG. 9 illustrates the alternative selection of the slots 66 and 68 (only two of these being shown) but their function is exactly the same as described above.

FIGS. 10 and 11 show alternative embodiments to the invention where the apertures in the lead frame are circular as at 80 rather than oblong slots and diamond shaped pins 82 are formed in the mold with the pins major axis transverse the direction of expansion and contraction. The minor axis allows for expansion and contraction in this direction.

FIG. 11 is similar to FIG. 10 except that in lieu of a diamond shaped pin, a oblong pin 84, whose major axis is transverse the direction of expansion and contraction, is used. The operation of the circular apertures and pins is the same as that described in connection with the preceding figures and these embodiments of the invention may be utilized in lieu of the slots and pins described in connection with the preceding embodiments, if desired.

Figure 1:
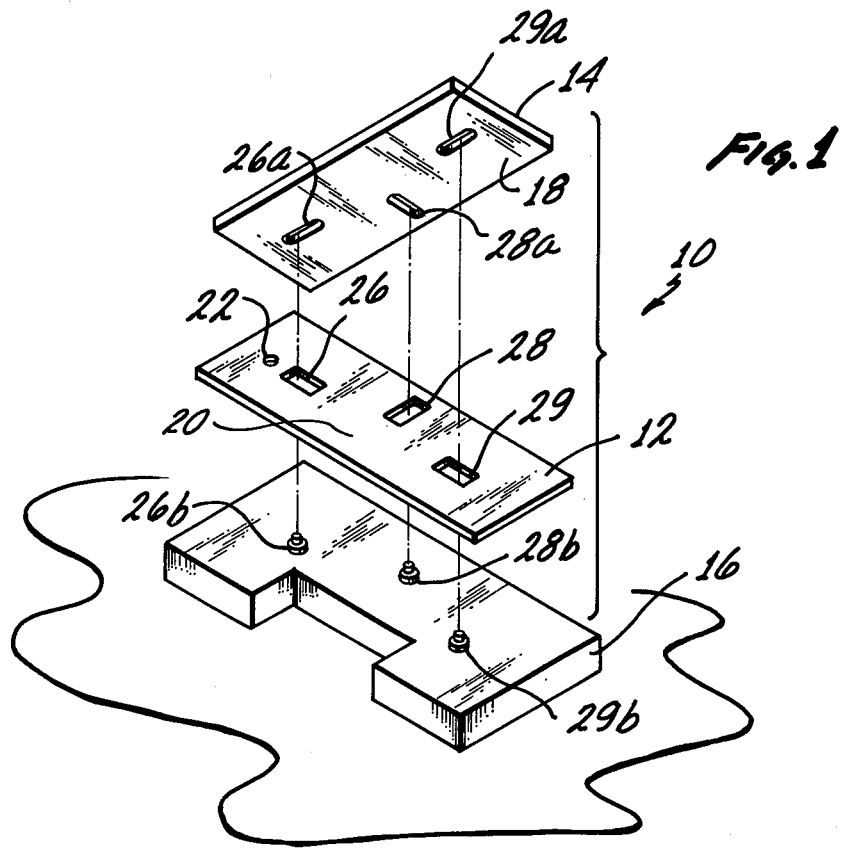
FIG. 1 is an exploded view of a fixture, heat sink and substrate incorporating this invention.
Figure 2:
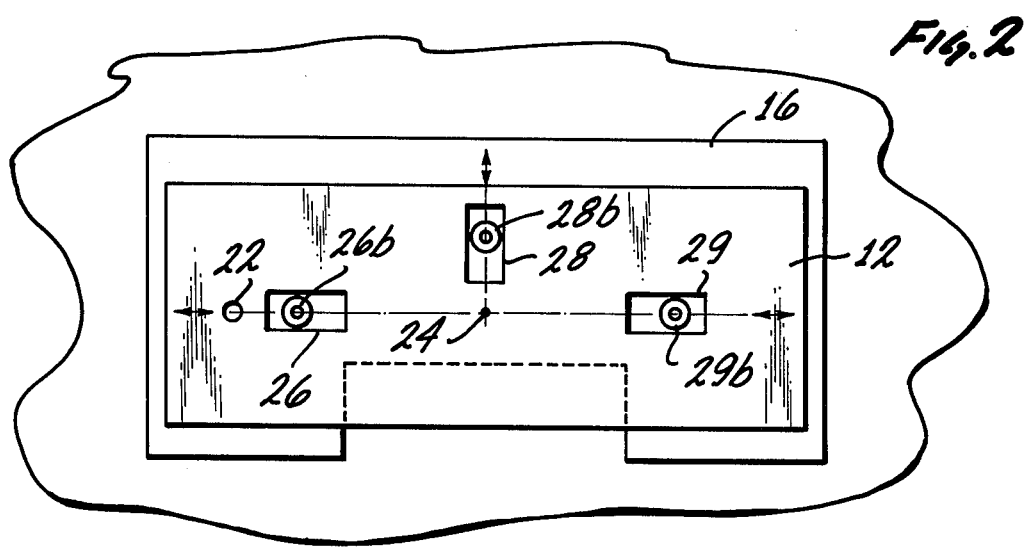
FIG. 2 is a plan view of the heat sink in place on the fixture of FIG. 1.
Figure 3:
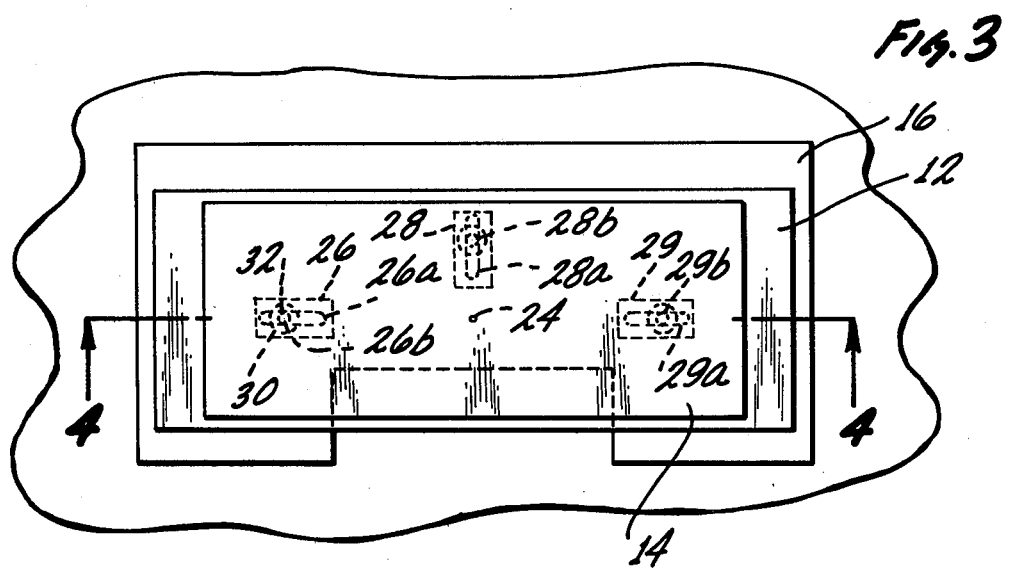
FIG. 3 is also a plan view, like FIG. 2, but showing the substrate in place on the heat sink and fixture.
Figure 4:
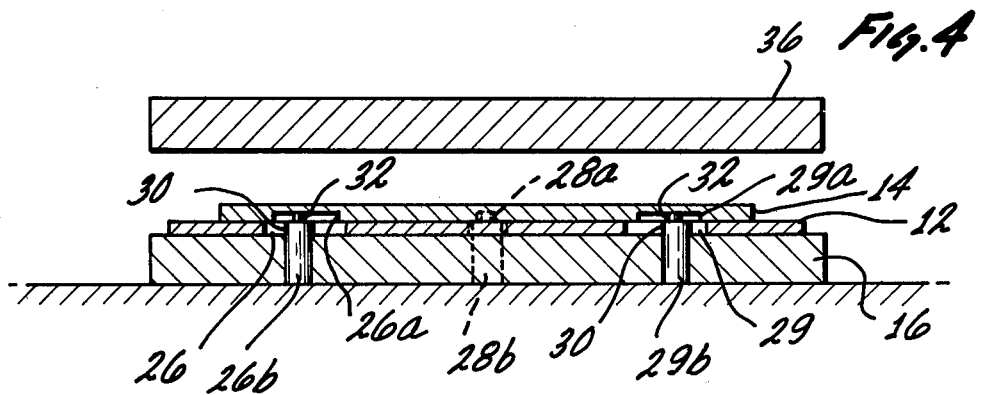
Figure 5:
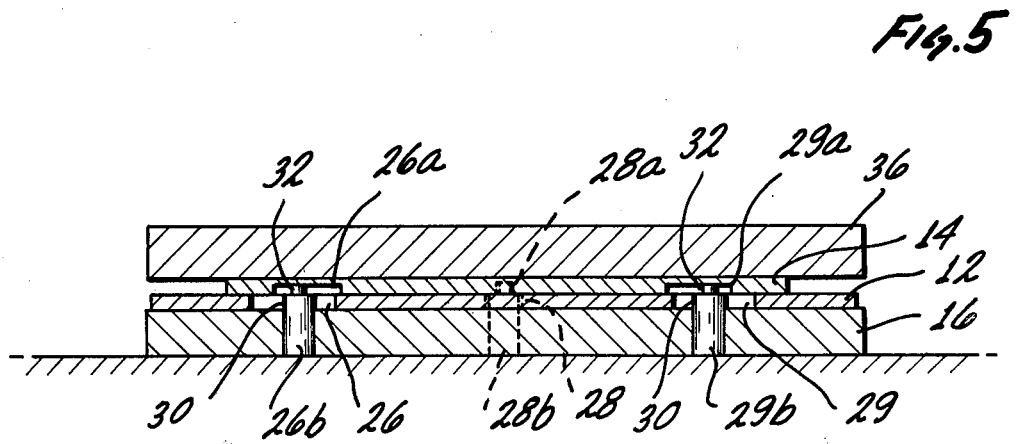
Figure 6:
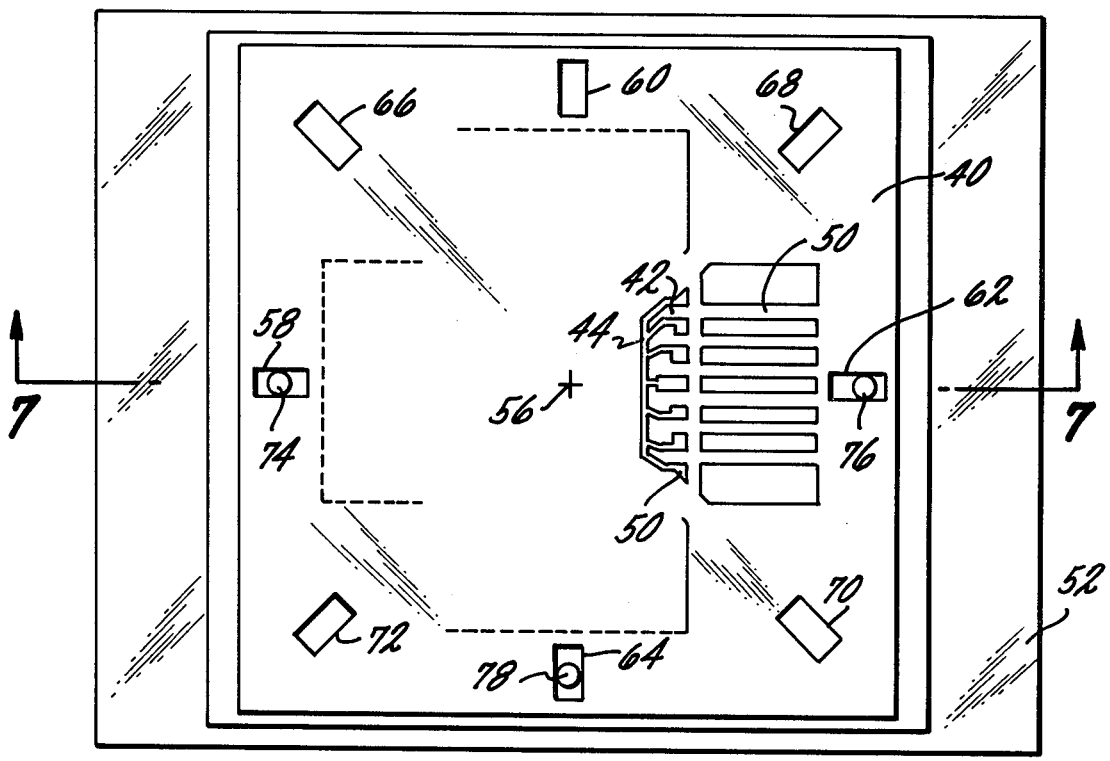
Figure 7:
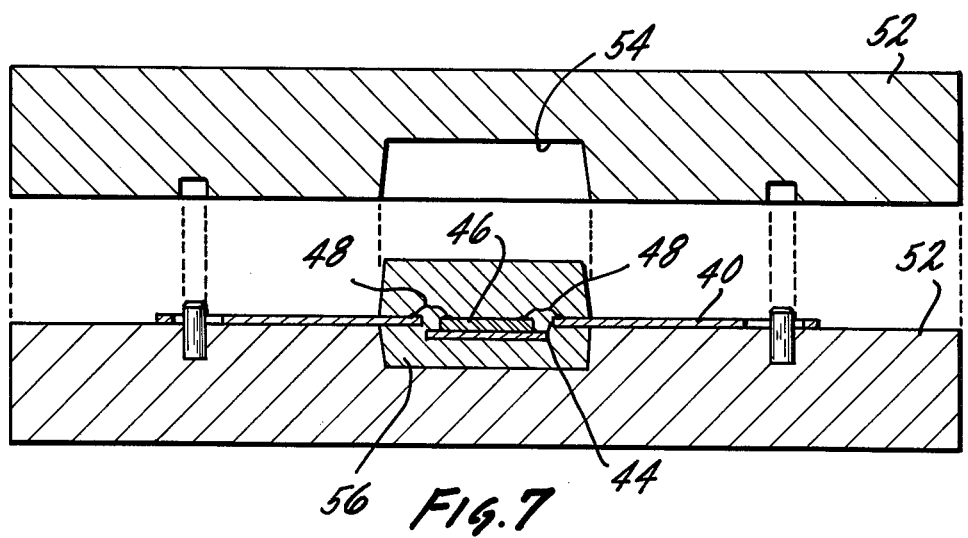
FIG. 7 illustrates the mold in its heated stage and the position of the slots during the expansion of the lead frame.

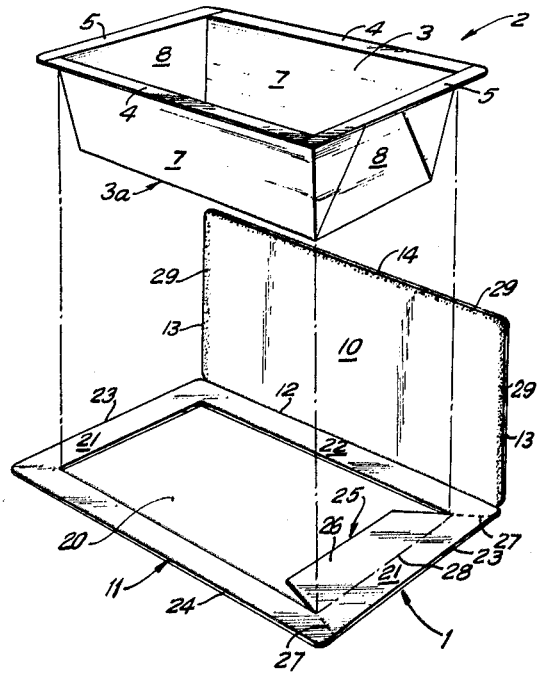

What is claimed is:

1. A method of bonding together first and second pieces of material having respective planar surfaces and having different coefficients of thermal expansion by a heating process comprising the steps of:
   forming oblong holes about the center of minimum thermal expansion in the planar surface of said first piece having longitudinal axial lines that intersect said center;
   forming oblong holes about the center of minimum thermal expansion in the planar surface of said second piece aligned with said oblong holes in said first piece;
   forming an assembly with the planar surface of said first piece facing the planar surface of said second piece and a bonding material therebetween, and with said oblong holes of both pieces being held in alignment with each other by pins of a fixture that pass through said holes; and
   heating said assembly to bond said first and second pieces together via said bonding material, said pins sliding in said oblong holes along said axial lines to accommodate a sliding movement that occurs between said planar surfaces in a direction parallel to said planar surfaces during said heating step due to said different coefficients of thermal expansion.

2. A method according to claim 1 wherein at least three of said oblong holes are formed in said first piece, and at least three of said oblong holes are formed in said second piece.

3. A method according to claim 1 wherein said oblong holes are arranged in a triangular fashion about the respective centers of said pieces.

4. A method according to claim 1 wherein said first piece of material is a heat sink for an integrated circuit package, and said second piece of material is a substrate for said package.

5. A method according to claim 1 wherein said bonding material is solder.

6. For use in a bonding operation, a method of maintaining the alignment of a planar-shaped part as said part is heated and thermally expands, said method including the steps of:
   forming oblong-shaped slots in said part arranged about the center of minimum thermal expansion in the plane of said part,
   each of said slots having a center line an extension of which intersects said center and having end walls intersecting said center line,
   providing a fixture having pins arranged perpendicular to said plane which fit into said slots;
   placing said part on said fixture with said pins in said slots; and
   heating and thermally expanding said part;
   the relationship of the slots and pins being such that said pins move along said center lines without engaging the end walls of said slots when said part thermally expands in response to said heating step.

7. A method according to claim 6 wherein at least three of said slots are formed in said part.

8. A method according to claim 6 wherein said slots are arranged in a triangular fashion about said center.

9. A method according to claim 6 and further including the steps of:
   forming an assembly wherein the planar surface of said part faces the planar surface of another piece of material and a bonding material lies therebetween; and
   heating said assembly to bond said two planar surfaces together.

10. A method according to claim 6 wherein said part is a heat sink for an integrated circuit package.

* * * * *

United States Patent [19]

Brunone et al.

[11] Patent Number: 4,463,893

[45] Date of Patent: Aug. 7, 1984

[54] REPLACEABLE LID FOR FLANGED TRAYS

[75] Inventors: William T. Brunone, Plymouth; Duane Mode, Eden Prairie, both of Minn.; Michael R. Russell, Grand Ledge, Mich.

[73] Assignee: Champion International Corporation, Stamford, Conn.

[21] Appl. No.: 467,737

[22] Filed: Feb. 18, 1983

[51] Int. Cl.³ ............................................. B65D 5/64
[52] U.S. Cl. ..................................... 229/43; 206/468; 206/633; 229/7 SC
[58] Field of Search ......................... 229/43, 9, 7 SC; 206/468, 633; 220/351, 359

[56] References Cited

U.S. PATENT DOCUMENTS

| | | | |
|---|---|---|---|
| 2,077,047 | 4/1937 | Kondolf | 229/43 |
| 2,102,094 | 12/1937 | Romig | 220/351 |
| 3,074,611 | 1/1963 | Tolaas | 229/9 |
| 3,215,333 | 11/1965 | Stelzer | 206/633 X |
| 3,393,860 | 7/1968 | Maki | 229/43 |
| 3,580,478 | 5/1971 | Bemiss | 229/43 |
| 3,715,073 | 2/1973 | Gibbs | 229/43 |
| 3,862,703 | 1/1975 | Dutcher | 229/43 |
| 3,876,133 | 4/1975 | Smith | 229/43 |
| 4,190,191 | 2/1980 | Forbes | 229/43 |
| 4,360,148 | 11/1982 | Forbes | 229/43 |

FOREIGN PATENT DOCUMENTS

| | | | |
|---|---|---|---|
| 2144653 | 3/1973 | Fed. Rep. of Germany | 229/43 |
| 1384547 | 2/1975 | United Kingdom | 206/468 |

*Primary Examiner*—William Price
*Assistant Examiner*—Gary E. Elkins
*Attorney, Agent, or Firm*—Evelyn M. Sommer

[57] ABSTRACT

A replaceable lid for a flanged tray in which the lid has opposed slide channels to receive the tray flanges in order to permit the lid to slide off the tray and be reapplied to the tray. A tamper resistant safety tab may also be provided to prevent tampering with the contents of the tray when the tray is on a shelf. The lid is made of a single blank having two panels with one of the panels having an opening to receive the tray and the other panel being folded over the first panel of the tray and adhered to the first panel along its outer edges.

11 Claims, 7 Drawing Figures